(12) United States Patent
Yamamoto et al.

(10) Patent No.: US 11,684,999 B2
(45) Date of Patent: Jun. 27, 2023

(54) LASER IRRADIATION APPARATUS

(71) Applicant: JSW AKTINA SYSTEM CO., LTD., Yokohama (JP)

(72) Inventors: Atsushi Yamamoto, Yokohama (JP); Hirotaka Sazuka, Yokohama (JP); Daisuke Ito, Yokohama (JP)

(73) Assignee: JSW AKTINA SYSTEM CO., LTD, Yokohama (JP)

( * ) Notice: Subject to any disclaimer, the term of this patent is extended or adjusted under 35 U.S.C. 154(b) by 471 days.

(21) Appl. No.: 16/632,344

(22) PCT Filed: Aug. 25, 2017

(86) PCT No.: PCT/JP2017/030472
§ 371 (c)(1),
(2) Date: Jan. 18, 2020

(87) PCT Pub. No.: WO2019/038902
PCT Pub. Date: Feb. 28, 2019

(65) Prior Publication Data
US 2020/0180071 A1 Jun. 11, 2020

(51) Int. Cl.
*H01L 21/68* (2006.01)
*B23K 26/08* (2014.01)
(Continued)

(52) U.S. Cl.
CPC ........ *B23K 26/08* (2013.01); *H01L 21/67742* (2013.01); *H01L 21/68742* (2013.01)

(58) Field of Classification Search
CPC combination set(s) only.
See application file for complete search history.

(56) References Cited

U.S. PATENT DOCUMENTS 5,989,346 A 11/1999 Hiroki
6,485,248 B1 * 11/2002 Taylor, Jr. ......... H01L 21/68742
414/217
(Continued)

FOREIGN PATENT DOCUMENTS

JP 2001-160584 A 6/2001
JP 2004-179671 A 6/2004
(Continued)

OTHER PUBLICATIONS

International Search Report from International Patent Application No. PCT/JP2017/030472, dated Nov. 21, 2017.

*Primary Examiner* — Ronald P Jarrett
(74) *Attorney, Agent, or Firm* — Potomac Law Group, PLLC

(57) ABSTRACT

To realize a laser irradiation apparatus by using which accuracy in processing a substrate can be improved. A laser irradiation apparatus according to an embodiment includes a laser irradiation unit configured to apply laser light to a substrate, a base part, and a conveyance stage configured to convey the substrate. The conveyance stage includes a stage configured to be movable over the base part, a base flange fixed over the stage, a substrate stage fixed to an upper end part of the base flange and configured so that the substrate is placed thereover, and a pusher pin for supporting the substrate, the pusher pin being configured to penetrate the substrate stage and to be movable up and down.

14 Claims, 21 Drawing Sheets

(51) Int. Cl.
*H01L 21/677* (2006.01)
*H01L 21/687* (2006.01)

(56) References Cited

U.S. PATENT DOCUMENTS

| | | | | |
|---|---|---|---|---|
| 10,386,661 | B2* | 8/2019 | Xu | G02F 1/1303 |
| 10,752,449 | B2* | 8/2020 | Aoki | G03F 7/70 |
| 2004/0123952 | A1* | 7/2004 | Hur | H01L 21/68742 |
| | | | | 156/345.31 |
| 2016/0254151 | A1* | 9/2016 | Tian | H01L 27/1274 |
| | | | | 438/487 |
| 2017/0198395 | A1* | 7/2017 | Nozawa | H01L 21/68742 |

FOREIGN PATENT DOCUMENTS

| | | | | |
|---|---|---|---|---|
| JP | 2006-005032 A | | 1/2006 | |
| JP | 2006-196862 A | | 7/2006 | |
| JP | 2012-256027 A | | 12/2012 | |
| KR | 101740220 | * | 5/2017 | ........... H01L 21/677 |

* cited by examiner

LASER IRRADIATION APPARATUS

TECHNICAL FIELD

The present invention relates to a laser irradiation apparatus.

BACKGROUND ART

Patent Literature 1 discloses a laser irradiation apparatus that lifts/lowers a substrate by a pusher pin when transferring the substrate between a robot and a substrate stage.

CITATION LIST

Patent Literature

Patent Literature 1: Japanese Unexamined Japanese Application Publication No. 2006-5032

SUMMARY OF INVENTION

Technical Problem

The inventors of the present invention have found various problems regarding a stage for conveying a substrate used in a laser irradiation apparatus.

Other problems to be solved and novel features will become apparent from the descriptions in this specification and the accompanying drawings.

Solution to Problem

A laser irradiation apparatus according to an embodiment includes a substrate stage fixed to an upper end part of a base flange and configured so that a substrate is placed thereover and a pusher pin for supporting the substrate to penetrate the substrate stage and to be movable up and down.

A laser irradiation apparatus according to another embodiment includes:

a substrate stage fixed to an upper end part of a base flange configured to rotate the substrate stage, the substrate stage being configured so that the substrate to be irradiated with a laser light is placed thereover; and a motor connected to a bottom surface of the substrate stage, the motor being configured to move the pusher pin for supporting the substrate that penetrates the substrate stage and the pusher blade for supporting the substrate that is disposed on the periphery of the substrate stage up and down.

Advantageous Effects of Invention

According to the aforementioned embodiments, accuracy in processing a substrate can be improved.

DESCRIPTION OF EMBODIMENTS

Specific embodiments will be described hereinafter with reference to the drawings. Note that the present invention is not to be limited to the embodiments described hereinafter. Further, the description and drawings mentioned hereinafter are simplified as appropriate for the sake of clarifying the explanation.

First Embodiment

Figure 1:
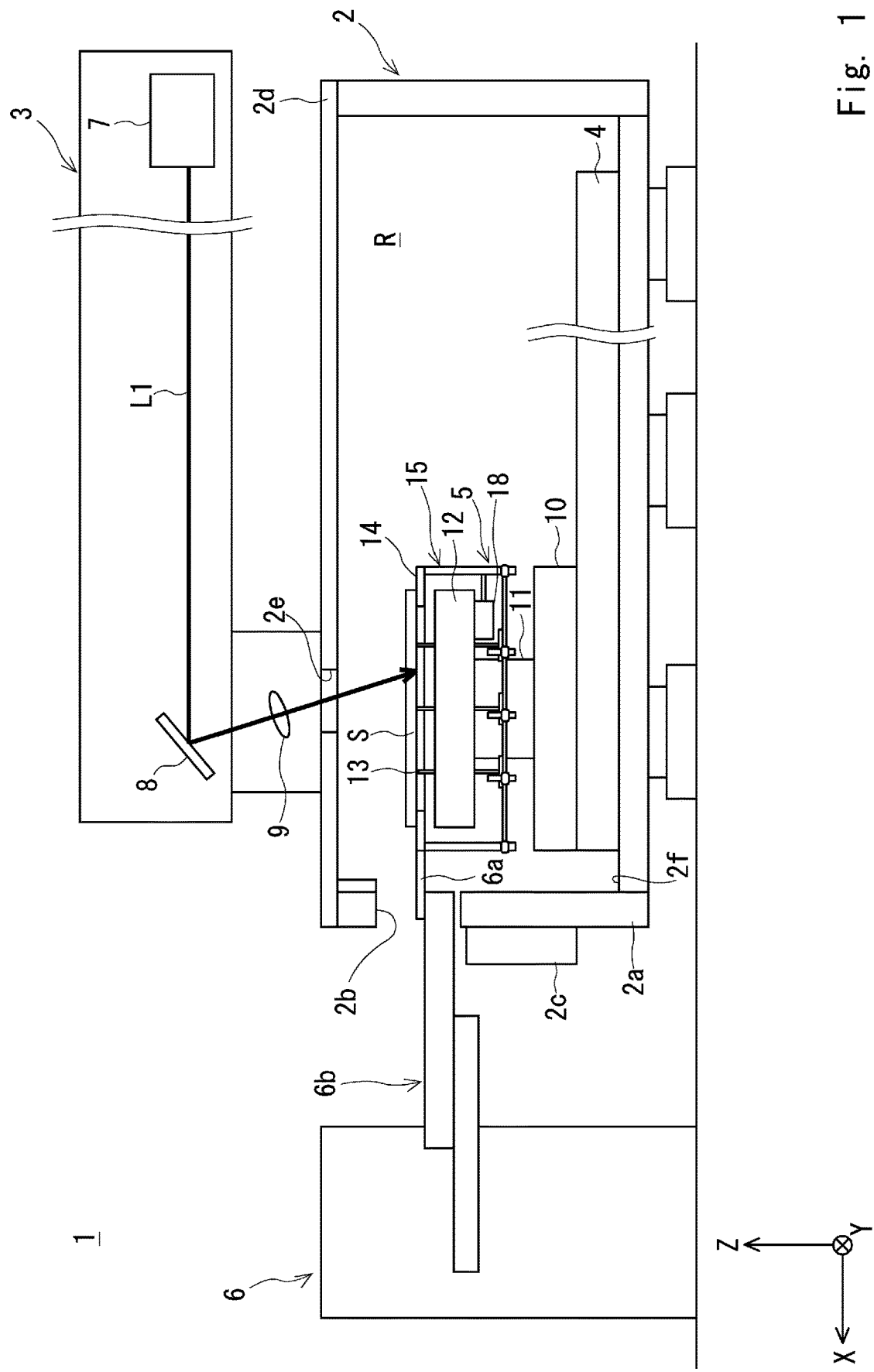
FIG. 1 is side view schematically showing a laser irradiation apparatus according to a first embodiment.
Figure 2:
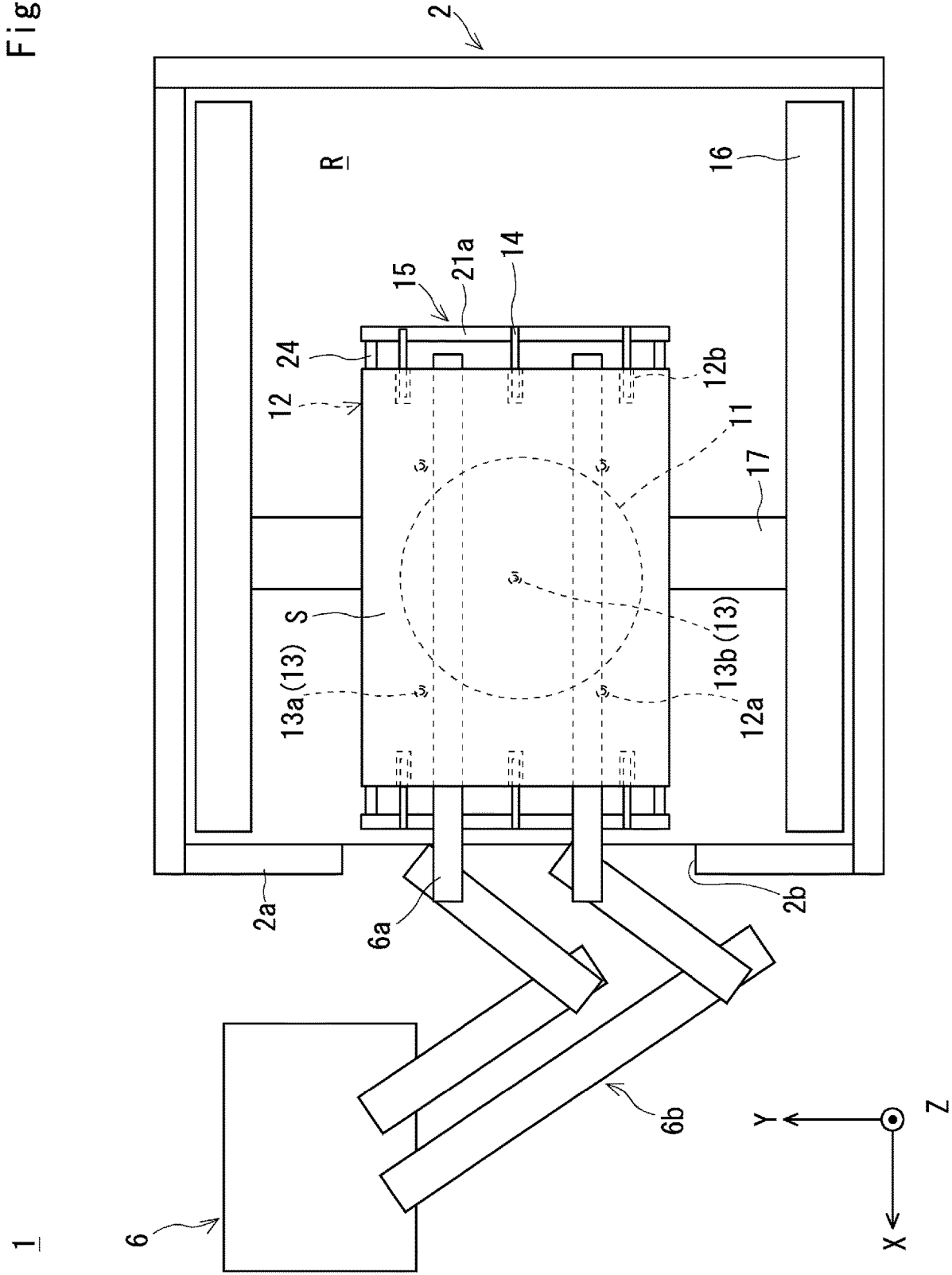
FIG. 2 is a plan view schematically showing the laser irradiation apparatus according to the first embodiment.

First, an overall configuration of a laser irradiation apparatus according to this embodiment is explained. FIG. 1 is a side view schematically showing the laser irradiation apparatus according to this embodiment. FIG. 2 is a plan view schematically showing the laser irradiation apparatus according to this embodiment. Note that in FIGS. 1 and 2, the laser irradiation apparatus is shown in a simplified manner. Hereinbelow, an XYZ orthogonal coordinate system is used for the sake of clarifying the explanation. Here, the Z-axis direction is a vertical direction and the XY plane is a horizontal plane.

A laser irradiation apparatus 1 is suitable for an excimer-laser annealing apparatus by which laser light is applied to an amorphous semiconductor formed in a substrate S to thereby form a polycrystalline semiconductor. Alternatively, the laser irradiation apparatus 1 may be applied to a laser release apparatus by which a release layer formed to the substrate S is released by applying a laser light thereto. Here, the substrate S may be, for example, formed of a glass substrate.

Specifically, as shown in FIGS. 1 and 2, the laser irradiation apparatus 1 includes a chamber 2, a laser irradiation unit 3, a base part 4, and a conveyance stage 5, and transfers the substrate S to and from a substrate conveyance mechanism 6. The inside of the chamber 2 serves as a processing room R where processing is performed to the substrate S received from the substrate conveyance mechanism 6 by applying the laser light to the substrate S. Further, the processing room R is, for example, in an inert gas atmosphere such as nitrogen gas.

A conveyance port 2b is provided to a side wall 2a on the X-axis positive side of the chamber 2 through which the substrate S is conveyed into the processing room R using the substrate conveyance mechanism 6 or the processed substrate S is conveyed out from the processing room R using the substrate conveyance mechanism 6. The conveyance port 2b can be opened/closed by a shutter 2c.

Here, the substrate conveyance mechanism 6 is disposed on the X-axis positive side of the laser irradiation apparatus 1 and includes a robot hand 6b having a fork 6a at its tip end part. The aforementioned substrate conveyance mechanism 6 conveys the substrate S placed over a surface of the fork 6a on the Z-axis positive side into or out from the processing room R through the conveyance port 2b of the chamber 2.

The laser irradiation unit 3 is an optical system for processing the substrate S by applying a laser light L1 thereto. The laser irradiation unit 3 is disposed on the Z-axis positive side of the chamber 2 as shown in FIG. 1. The aforementioned laser irradiation unit 3 includes a laser light source 7, a mirror 8, and a projection lens 9.

The laser light L1 emitted from the laser light source 7 is made incident to the projection lens 9 via the mirror 8. Then, the laser light L1 emitted from the projection lens 9 is made incident to the processing room R through an opening 2e formed in a ceiling 2d of the chamber 2. The laser light L1 at this time is applied to a predefined irradiation region of the processing room R as a linear beam, the longitudinal direction of the laser beam being the Y-axis direction.

The base part 4 is a surface plate fixed to a bottom surface 2f of the chamber 2. The conveyance stage 5 conveys the substrate S such that a desired region of the substrate S is irradiated with the laser light L1 in the processing room R. The conveyance stage 5 includes a stage 10, a base flange 11, a substrate stage 12, a pusher pin 13, a pusher blade 14, and a driving unit 15 as shown in FIG. 1.

The stage 10 is movable on the Z-axis positive side with respect to the base part 4. The stage 10 is, for example, an XY stage, and moves substantially horizontally along an X-axis rail 16 extending in the X-axis direction and a Y-axis rail 17 extending in the Y-axis direction as shown in FIG. 2. The base flange 11 is fixed to a surface of the stage 10 on the Z-axis positive side. The base flange 11 is, for example, a rotary driving apparatus that rotates about a rotational axis extending in the Z-axis direction.

The substrate S is placed over the substrate stage 12. The substrate stage 12 is, for example, an adsorption stage, and has a rectangular shape when viewed in the Z-axis direction. The aforementioned substrate stage 12 is fixed to an end part of the base flange 11 on the Z-axis positive side such that the center of the substrate stage 12 is disposed substantially on the rotational axis of the base flange 11.

Figure 3:
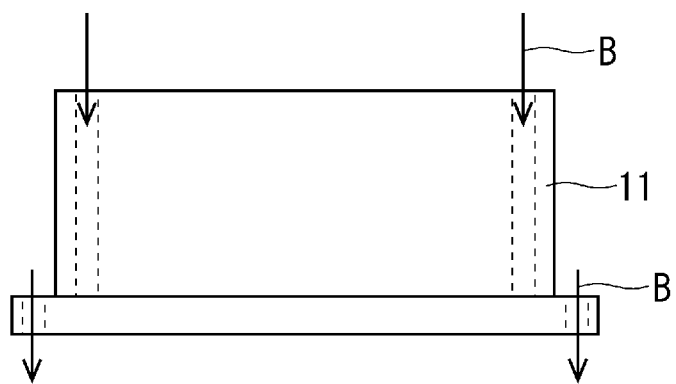
FIG. 3 is a diagram for explaining a connection configuration of a base flange according to the first embodiment.

FIG. 3 is a diagram for explaining a connection configuration of the base flange according to this embodiment. The substrate stage 12 may, for example, preferably be connected to the end part of the base flange 11 on the Z-axis positive side by a bolt B as shown in FIG. 3. That is, the substrate stage 12 is fixed to the base flange 11 without having to dispose the pusher pin 13 or the driving unit 15 for driving the pusher blade 14 between the base flange 11 and the substrate stage 12.

Incidentally, the stage 10, the base flange 11, and the substrate stage 12 can be easily connected with each other by also connecting the end part of the base flange 11 on the Z-axis negative side to the stage 10 by the bolt B. It is to be noted that the means for connecting the stage 10 and the base flange 11 with each other and that for connecting the base flange 11 and the substrate stage 12 with each other are not limited to a bolt, and other means may suffice as long as the connections are made without having to interpose a component that is high in the Z-axis direction, such as the driving unit 15, between the stage 10 and the base flange 11 and between the base flange 11 and the substrate stage 12.

The pusher pin 13 and the pusher blade 14 lift/lower the substrate S when they are transferring the substrate S between the substrate conveyance mechanism 6 and the substrate stage 12. Specifically, as shown in FIG. 1, the pusher pin 13 and the pusher blade 14 elevate the substrate S in the Z-axis positive direction when they are transferring the substrate S between the substrate conveyance mechanism 6 and the substrate stage 12 in order to ensure a desired space between the substrate stage 12 and the substrate S for inserting the fork 6a of the substrate conveyance mechanism 6. Further, the pusher pin 13 and the pusher blade 14 lower the substrate S in the Z-axis negative direction in order to place the substrate S received from the substrate conveyance mechanism 6 onto a surface of the substrate stage 12 on the Z-axis positive side.

The pusher pin 13 is a rod-like member extending in the Z-axis direction. The pusher pin 13 penetrates the substrate stage 12 and is capable of moving up and down in the Z-axis direction owing to the driving unit 15. Specifically, the pusher pin 13 is passed through a penetrating hole 12a that penetrates the substrate stage 12 in the Z-axis direction. Further, the end part of the pusher pin 13 on the Z-axis negative side is connected to the driving unit 15.

In this embodiment, as shown in FIG. 2, a first pusher pin 13a and a second pusher pin 13b are provided as the pusher pin 13. The first pusher pin 13a is disposed along a periphery of the substrate stage 12. For example, when the long side of the substrate stage 12 is oriented in the X-axis direction, two first pusher pins 13a are disposed along each of the long sides of the substrate stage 12 that are opposite to each other in the Y-axis direction as shown in FIG. 2. Note that the arrangement and the number of the first pusher pins 13a may be any as long as the substrate S can be lifted/lowered in a stable manner.

The second pusher pin 13b is disposed substantially at the center of the substrate stage 12 as shown in FIG. 2. That is, the second pusher pin 13b is disposed substantially on the rotational axis of the base flange 11.

As shown in FIGS. 1 and 2, the pusher blade 14 is an arm member extending substantially horizontally and is disposed on the periphery of the substrate stage 12. Further, the pusher blade 14 is capable of moving up and down in the Z-axis direction in association with the pusher pin 13 owing to the driving unit 15.

Specifically, as shown in FIG. 2, one end part of the pusher blade 14 is disposed on an inner side of a planar region of the substrate stage 12 when viewed in the Z-axis direction and can be accommodated in a groove 12b formed so as to cut-out a surface of the substrate stage 12 on the Z-axis positive side and a side surface that is continuous with the surface of the substrate stage 12 on the Z-axis positive side. Meanwhile, the other end part of the pusher blade 14 is disposed on an outer side of the planar region of the substrate stage 12 when viewed in the Z-axis direction and is connected to the driving unit 15.

For example, when the long side of the substrate stage 12 is oriented in the X-axis direction, three pusher blades 14 are disposed along each of the short sides of the substrate stage 12 that are opposite to each other in the X-axis direction as shown in FIG. 2. Further, the pusher blade 14 is oriented in the X-axis direction so as to be substantially orthogonal to the short side of the substrate stage 12 when viewed in the Z-axis direction. Note that the arrangement and the number of the pusher blade 14 may be any as long as the substrate S can be lifted/lowered in a stable manner.

Figure 4:
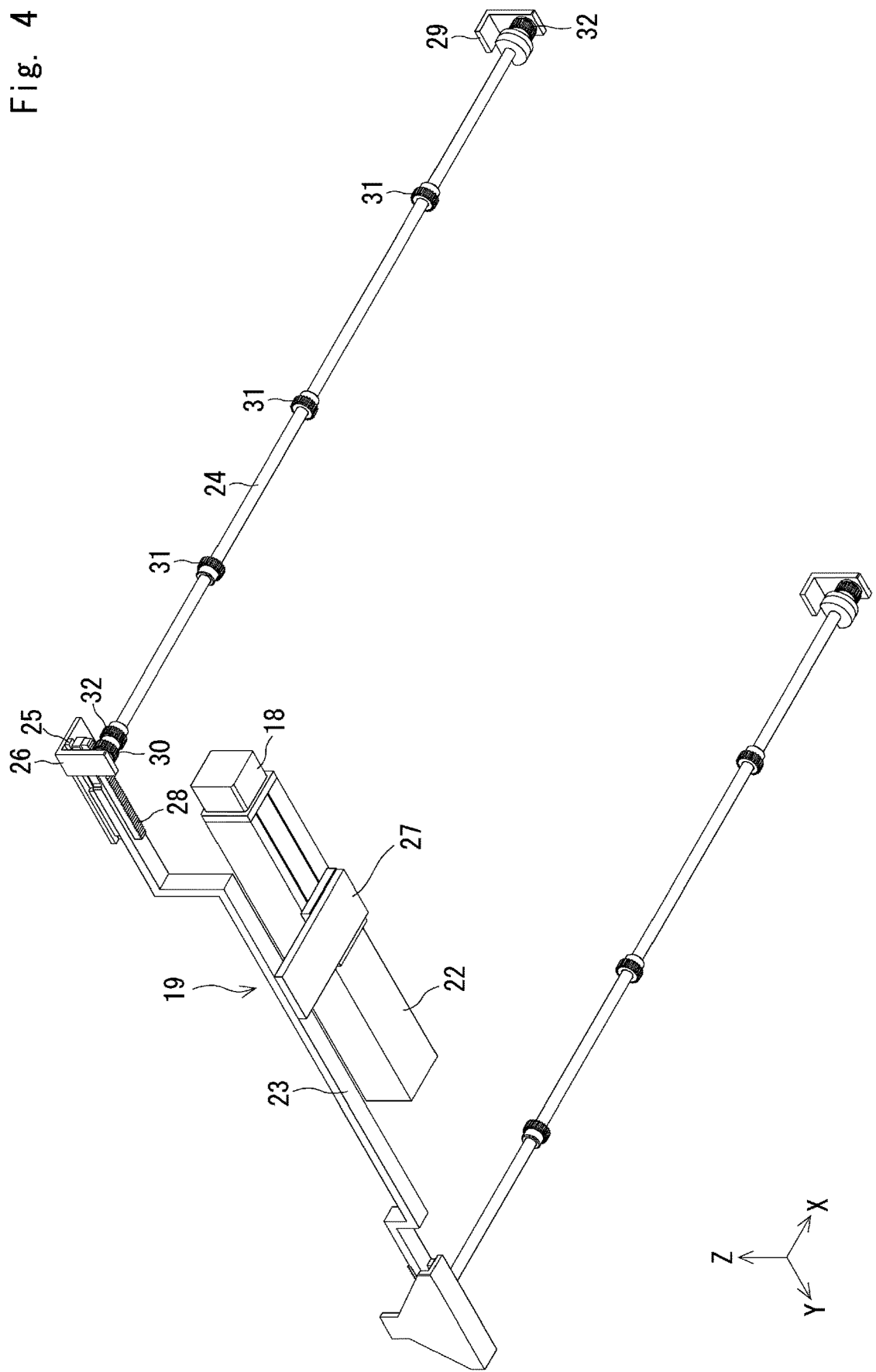
FIG. 4 is a perspective view schematically showing a first driving force transmission unit of a driving unit according to the first embodiment.
Figure 5:
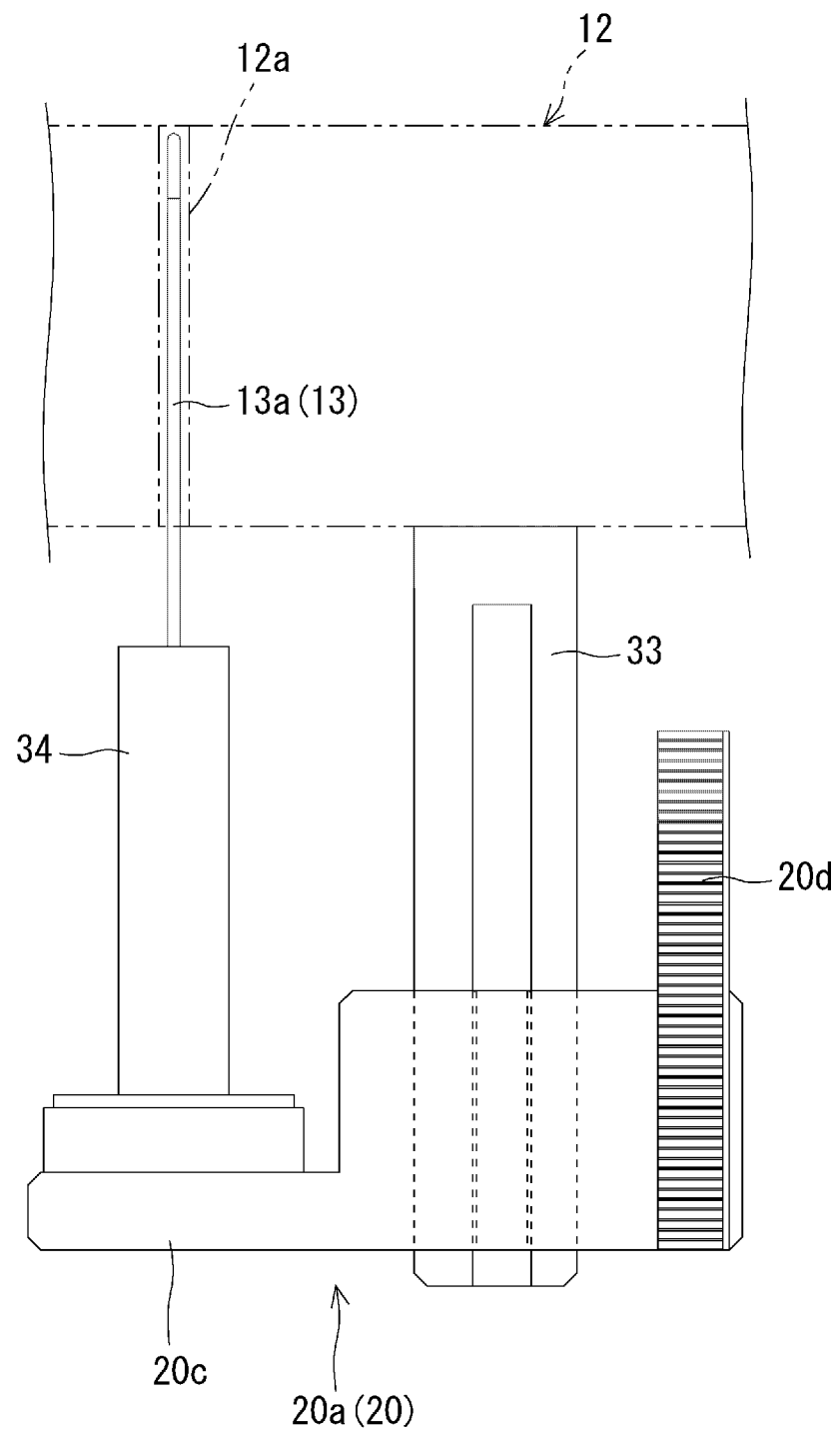
FIG. 5 is a diagram schematically showing a second driving force transmission unit of the driving unit according to the first embodiment.
Figure 6:
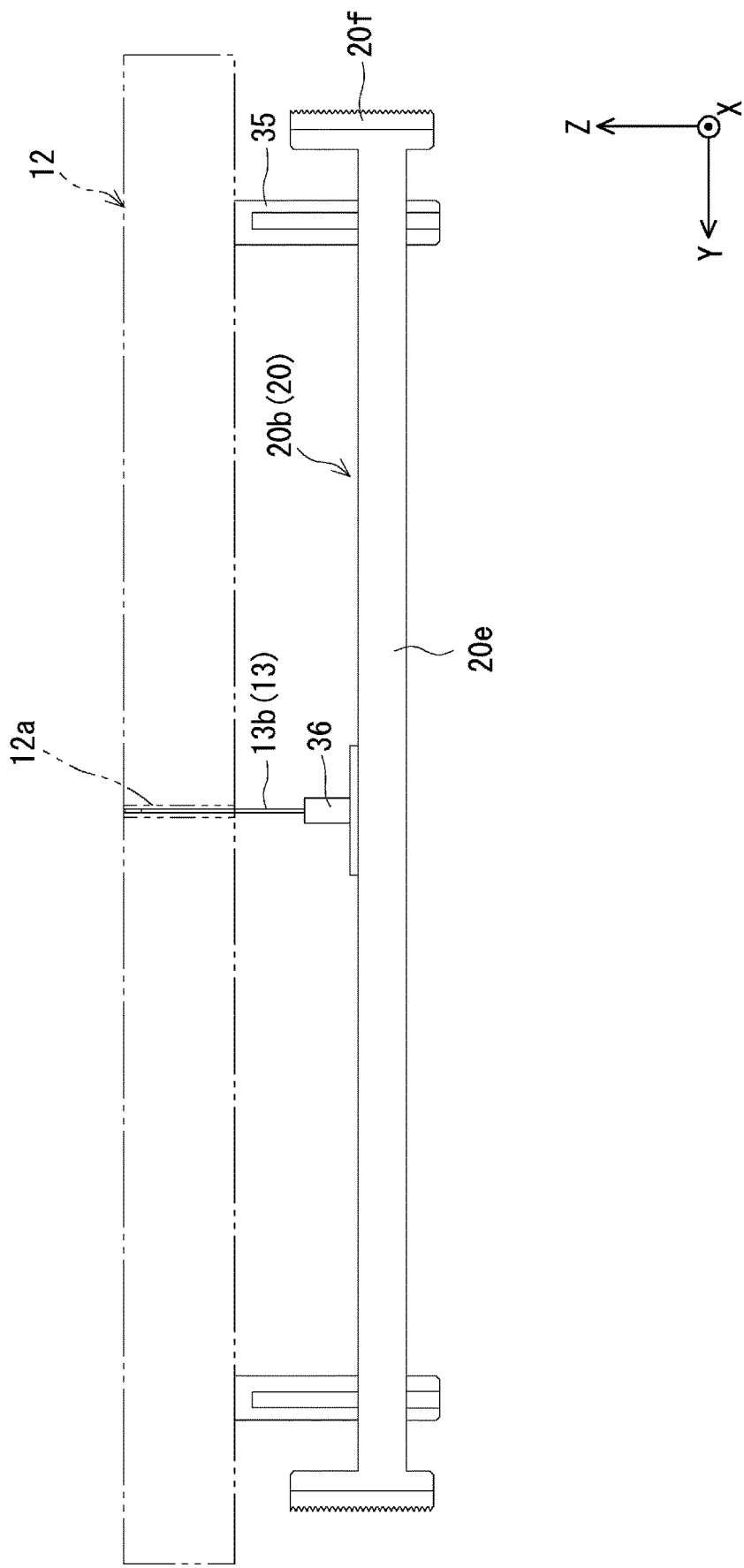
FIG. 6 is a diagram schematically showing another second driving force transmission unit of the driving unit according to the first embodiment.
Figure 7:
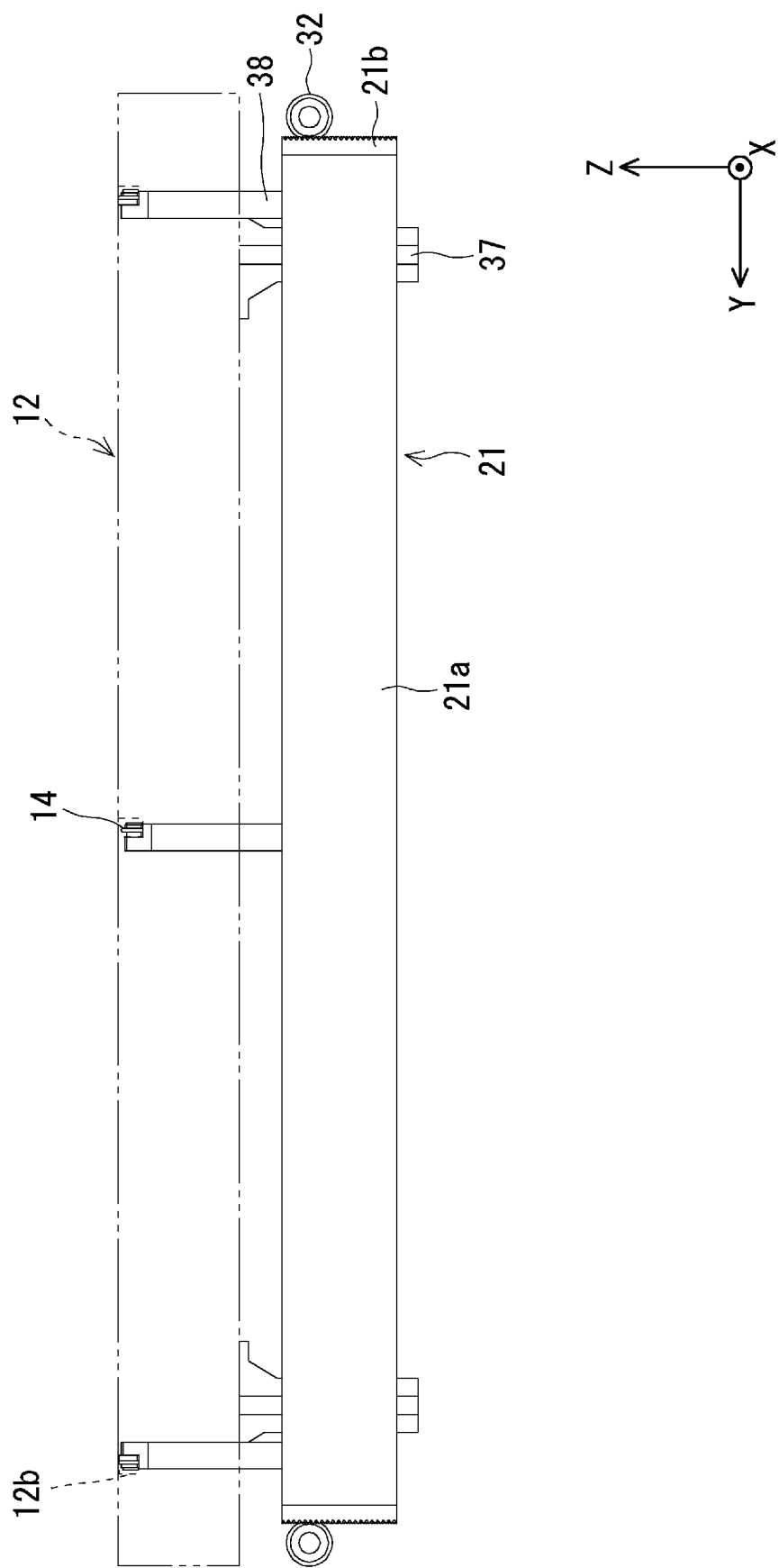
FIG. 7 is a diagram schematically showing a third driving force transmission unit of the driving unit according to the first embodiment.

The driving unit 15 moves the pusher pin 13 and the pusher blade 14 up and down. Here, FIG. 4 is a perspective view schematically showing a first driving force transmission unit of a driving unit according to this embodiment. FIG. 5 is a diagram schematically showing a second driving force transmission unit of the driving unit according to this embodiment. FIG. 6 is a diagram schematically showing another second driving force transmission unit of the driving unit according to this embodiment. FIG. 7 is a diagram schematically showing a third driving force transmission unit of the driving unit according to this embodiment.

The driving unit 15 includes, for example, a motor 18, a first driving force transmission unit 19, a second driving force transmission unit 20, and a third driving force transmission unit 21 as shown in FIGS. 4 to 7. The motor 18 is disposed on a side of the base flange 11 and is fixed to a surface of the substrate stage 12 on the Z-axis negative side. The first driving force transmission unit 19 includes a linear driving unit 22, a transmission arm 23, and a rotary shaft 24.

The linear driving unit 22 converts the rotational driving force of the motor 18 to a linear driving force. For example, when the long side of the substrate stage 12 is oriented in the X-axis direction, the linear driving unit 22 includes a screw shaft extending in the Y-axis direction and a ball screw having a nut engaged with the screw shaft, and a rotary shaft of the motor 18 is connected to the screw shaft. The linear driving unit 22 described above is disposed on the side of the base flange 11 and is fixed to the surface of the substrate stage 12 on the Z-axis negative side.

The transmission arm 23 is disposed substantially horizontally on the side of the base flange 11. For example, when the long side of the substrate stage 12 is oriented in the X-axis direction, the transmission arm 23 is disposed along the short side of the substrate stage 12 on the X-axis negative side and is fixed to the surface of the substrate stage 12 on the Z-axis negative side using a first fixing member 26 through a guiding mechanism (e.g. a linear guide) 25 for guiding the transmission arm 23 in the Y-axis direction.

The transmission arm 23 is connected to the nut of the linear driving unit 22 by a connecting member 27. By this configuration, when the linear driving unit 22 is driven, for example, the transmission arm 23 moves substantially horizontally in the Y-axis direction. A rack 28 extending in the longitudinal direction of the transmission arm 23 is provided to both end parts of the aforementioned transmission arm 23.

The rotary shaft 24 is disposed substantially horizontally on the side of the base flange 11. For example, when the long side of the substrate stage 12 is oriented in the X-axis direction, the two rotary shafts 24 are disposed substantially in parallel with each other along each of the long sides of the substrate stage 12 that are opposite to each other in the Y-axis direction. Further, the rotary shaft 24 is fixed to a surface of the substrate stage 12 on the Z-axis negative side by the first fixing member 26 and a second fixing member 29, the first fixing member being employed in common with the transmission arm 23.

The aforementioned rotary shaft 24 is provided with a first pinion 30, a second pinion 31, and a third pinion 32 as shown in FIG. 4. The first pinion 30 is engaged with the rack 28 of the transmission arm 23 and transmits the driving force received from the transmission arm 23 to the rotary shaft 24.

At this time, as shown in FIG. 4, one of the racks 28 of the transmission arm 23 engages with the first pinion 30 of one of the rotary shafts 24 from the Z-axis positive side, and the other one of the racks 28 of the transmission arm 23 engages with the first pinion 30 of the other one of the rotary shafts 24 from the Z-axis negative side. By this configuration, the two rotary shafts 24 are rotated in the same direction and by the same number of rotation as the transmission arm 23 moves.

The second pinion 31 transmits the driving force received from the rotary shaft 24 to the pusher pin 13 by the second driving force transmission unit 20. In this embodiment, a driving force transmission unit 20a that transmits the driving force received from the rotary shaft 24 to the first pusher pin 13a and a driving force transmission unit 20b that transmits the driving force received from the rotary shaft 24 to the second pusher pin 13b are provided as the second driving force transmission unit 20.

The driving force transmission unit 20a that transmits the driving force to the first pusher pin 13a includes a support part 20c and a rack 20d as shown in FIG. 5. The support part 20c is disposed on the side of the base flange 11 and is fixed to a surface of the substrate 12 on the Z-axis negative side by the guiding mechanism 33 for guiding the support part 20c in the Z-axis direction.

For example, the support part 20c is an arm member having one end part thereof connected to an end part of the first pusher pin 13a on the Z-axis negative side by a connecting member 34 and the other end part thereof connected to the rack 20d. A teeth surface of the rack 20d is oriented facing the outer side of the laser irradiation apparatus 1. Further, the rack 20d extends in the Z-axis direction and is engaged with the second pinion 31 of the rotary shaft 24. By this configuration, the first pusher pin 13a moves up and down in the Z-axis direction as the rotary shaft 24 rotates.

The driving force transmission unit 20b that transmits the driving force to the second pusher pin 13b includes a support part 20e and a rack 20f as shown in FIG. 6. The support part 20e passes through a penetrating hole formed in the base flange 11. The penetrating hole of the base flange 11 is formed so as to enable the support part 20e to ascend/descend in the Z-axis direction. The aforementioned support part 20e is fixed to a surface of the substrate stage 12 on the Z-axis negative side by the guiding mechanism 35 for guiding the support part 20e in the Z-axis direction.

For example, when the long side of the substrate stage 12 is oriented in the X-axis direction, the support part 20e is an arm member extending in the Y-axis direction and has an end part of the second pusher pin 13b on the Z-axis negative side connected to substantially the center thereof by a connecting member 36 and includes a rack 20f disposed at both end parts thereof. The teeth surface of the rack 20f is oriented facing the outer side of the laser irradiation apparatus 1. Further, the rack 20f extends in the Z-axis direction and is engaged with the second pinion 31 of the rotary shaft 24. By this configuration, the second pusher pin 13b moves up and down in the Z-axis direction as the rotary shaft 24 rotates.

The third pinion 32 transmits the driving force received from the rotary shaft 24 to the pusher blade 14 by the third driving force transmission unit 21. The third driving force transmission unit 21 includes a pusher arm 21a and a rack 21b as shown in FIG. 7. The pusher arm 21a is disposed on the outer side of the planar region of the substrate stage 12 and substantially in parallel with the transmission arm 23 when viewed in the Z-axis direction. Further, the pusher arm 21a is oriented substantially horizontally.

For example, when the long side of the substrate stage 12 is oriented in the X-axis direction, the two pusher arms 21a are disposed substantially in parallel with each other along each of the short sides of the substrate stage 12 that are opposite to each other in the X-axis direction. Then, each of the pusher arms 21a is fixed to a surface of the substrate stage 12 on the Z-axis negative side by the guiding mechanism 37 for guiding the pusher arms 21a in the Z-axis direction.

The other end part of the pusher blade 14 is connected to the pusher arm 21a by a connecting member 38. The connecting member 38 is disposed on the outer side of the planar region of the substrate stage 12 when viewed in the Z-axis direction. Further, the connecting member 38 supports the end part of the pusher blade 14 on the Z-axis positive side at a height substantially the same as that of the end part of the pusher pin 13 on the Z-axis positive side.

The rack 21b is provided to both end parts of the pusher arm 21a. The teeth surface of the rack 21b is oriented facing the outer side of the laser irradiation apparatus 1. Further, the rack 21b extends in the Z-axis direction and is engaged with the third pinion 32 of the rotary shaft 24. By this configuration, the pusher blade 14 moves up and down in the Z-axis direction as the rotary shaft 24 rotates.

Next, a flow of processing the substrate S using the laser irradiation apparatus 1 according to this embodiment is explained. First, the conveyance port 2b is opened by operating the shutter 2c of the chamber 2 and the substrate S placed over the fork 6a of the substrate conveyance mechanism 6 is conveyed into the processing room R through the conveyance port 2b. At this time, the pusher pin 13 and the pusher blade 14 are in an elevated state in the Z-axis positive direction.

Next, the substrate S is placed over the end part of the pusher pin 13 and that of the pusher blade 14 in the Z-axis positive side by the substrate conveyance mechanism 6. Then, the fork 6a of the substrate conveyance mechanism 6 is drawn out from the space between the substrate S and the substrate stage 12, and the substrate conveyance mechanism 6 is retreated from the processing room R. Then, the shutter 2c of the chamber 2 is operated to close the conveyance port 2b, and the processing room R becomes an airtight space.

Next, the motor 18 is rotationally driven to horizontally move the transmission arm 23 in one direction. Accordingly, the rotary shaft 24 rotates in one direction and the pusher blade 14 is lowered in the Z-axis negative direction by the third driving force transmission unit 21 while the pusher pin 13 is lowered in the Z-axis negative direction by the second driving force transmission unit 20, whereby the substrate S is placed over a surface of the substrate stage 12 on the Z-axis positive side. The substrate stage 12 adsorbs the substrate S.

At this time, the pusher pin 13 is accommodated in the penetrating hole 12a of the substrate stage 12 such that the end part of the pusher pin 13 on the Z-axis positive side does not protrude from the surface of the substrate stage 12 on the Z-axis positive side. Further, the pusher blade 14 is accommodated in the groove 12b of the substrate stage 12 such that one end part of the pusher blade 14 does not protrude from the surface of the substrate stage 12 on the Z-axis positive side.

Next, the stage 10 and the base flange 11 are controlled so as to apply the laser light L1 emitted from the laser irradiation unit 3 to a desired region of the substrate S in order to process the substrate S.

Here, the linear beam, the longitudinal direction thereof being oriented in the Y-axis direction, is applied to the substrate S.

Here, the motor 18 is fixed to a surface of the substrate stage 12 on the Z-axis negative side, and in addition, the transmission arm 23, the rotary shaft 24 etc. are disposed on the side of the base flange 11 and thus, the rotation of the substrate stage 12 about the Z-axis is not impeded.

After the processing of the substrate S is finished, the motor 18 is rotationally driven to move the transmission arm 23 substantially horizontally to the other side. Accordingly, the rotary shaft 24 rotates to the other side, and the pusher blade 14 elevates in the Z-axis positive direction by the third driving force transmission unit 21 while the pusher pin 13 elevates in the Z-axis positive direction by the second driving force transmission unit 20. As a result, the substrate S elevates in the Z-axis positive direction and a space is formed between the substrate S and the substrate stage 12 into which the fork 6a of the substrate conveyance mechanism 6 can be inserted.

Next, the shutter 2c of the chamber 2 is operated to open the conveyance port 2b, and the substrate conveyance mechanism 6 is retreated from the processing room R with the substrate S placed over the fork 6a thereof. Then, the substrate S is accommodated in, for example, an accommodating cartridge by the substrate conveyance mechanism 6, and the treatment of the substrate S ends.

Figure 8:
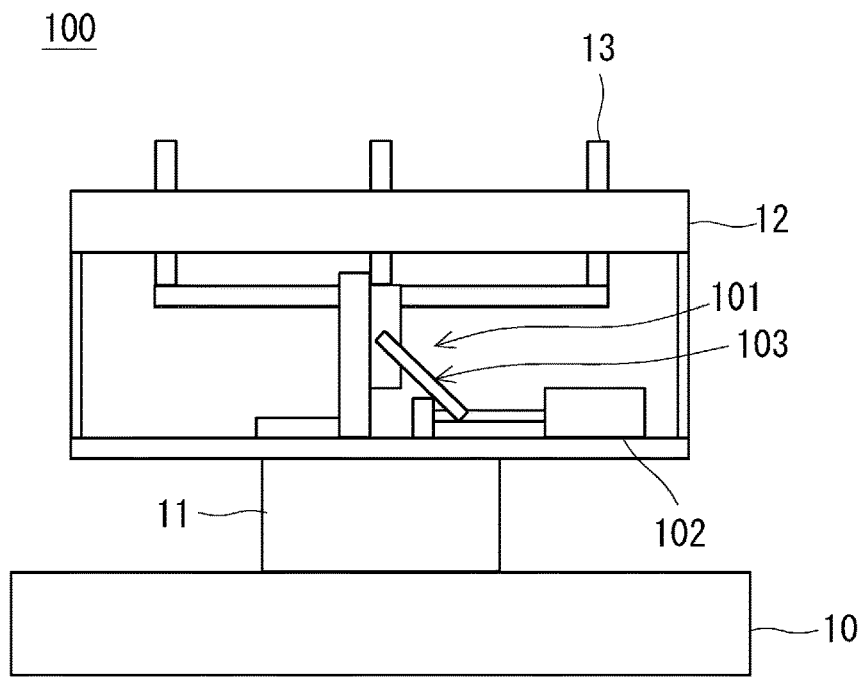
FIG. 8 is a side view schematically showing a conveyance stage of a laser irradiation apparatus according to a comparative example.

Next, the conveyance stage 5 of the laser irradiation apparatus 1 according to this embodiment and a conveyance stage of a laser irradiation apparatus according to a comparative example are compared. FIG. 8 is a side view schematically showing a conveyance stage of the laser irradiation apparatus according to the comparative example. Note that components that are equivalent to those of the laser irradiation apparatus according to this embodiment are assigned the same reference symbols.

A conveyance stage 100 of the laser irradiation apparatus according to the comparative example includes a driving unit 101 for moving the pusher pin 13 up and down between the base flange 11 and the substrate stage 12 as shown in FIG. 8. The driving unit 101, for example, converts the rotational driving force of the motor 102 to the linear driving force in the Z-axis direction by the link mechanism 103.

As described above, since the driving unit 101 is disposed between the base flange 11 and the substrate stage 12 in the conveyance stage 100 of the laser irradiation apparatus according to the comparative example, followability thereof to the movement of the stage 10 and the base flange 11 in the substrate stage 12 is low. Therefore, there is a possibility that accuracy in processing the substrate S may become low.

On the other hand, since the driving unit 15 is not disposed between the base flange 11 and the substrate unit 12 in the conveyance stage 5 of the laser irradiation apparatus 1 according to this embodiment, the center of gravity of the substrate stage 12 is lower compared to that of the conveyance stage of the laser irradiation apparatus according to the comparative example. By this configuration, the followability of the substrate stage 12 to the movement of the stage 10 and the base flange 11 is improved and the position of the substrate 12 and the accuracy of the moving speed of the substrate 12 during the processing are improved, whereby highly precise processing is possible. Therefore, accuracy in processing the substrate S can be improved by using the laser irradiation apparatus 1 according to this embodiment compared to the case where the laser irradiation apparatus according to the comparative example is used.

Moreover, the conveyance stage 5 of the laser irradiation apparatus 1 according to this embodiment supports a peripheral edge of the substrate S by the pusher blade 14 and thus, warpage of the substrate S when supporting the substrate S can be restrained compared to the conveyance stage 100 of the laser irradiation apparatus according to the comparative example in which the substrate S is supported only by the pusher pin 13.

Here, the end part of the pusher pin 13 or the pusher blade 14 on the Z-axis positive side may preferably include a resin part. In other words, it is preferable that the part of the pusher pin 13 or the pusher blade 14 that comes in contact with the substrate S be a resin part. The resin part may preferably be formed of, for example, a polyether ether ketone resin (PEEK resin). By this structure, damage to the substrate S can be restrained when the substrate S comes in contact with the pusher pin 13 or the pusher blade 14.

Figure 9:
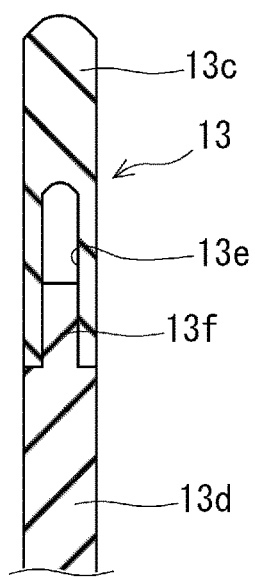
FIG. 9 is a sectional diagram schematically showing a tip end part of a pusher pin according to the first embodiment.

Here, the pusher pin 13 includes a resin part 13c on the Z-axis positive side and a base part 13d to which an end part of the resin part 13c on the Z-axis negative side is connected, and it is preferable that the resin part 13c be configured to be attachable/detachable to/from the base part 13d as shown in FIG. 9. For example, an engagement part 13f formed to an end part of the base part 13d on the Z-axis positive side is engaged with a fitting part 13e formed to an end part of the resin part 13c on the Z-axis negative side. By this configuration, only the resin part 13c can be easily replaced when it is worn out. Note that the resin part of the pusher blade 14 may also be replaceable.

Second Embodiment

A conveyance stage of a laser irradiation apparatus according to this embodiment has substantially the same configuration as the conveyance stage 5 of the laser irradiation apparatus 1 according to the first embodiment except that the arrangement of the pusher blade 14 differs. Note that the conveyance stage of the laser irradiation apparatus according to this embodiment has substantially the same configuration as the configuration of conveyance stage 5 of the laser irradiation apparatus 1 according to the first embodiment and thus, duplicated explanations are omitted and the same reference symbols are assigned to the equivalent elements.

Figure 10:
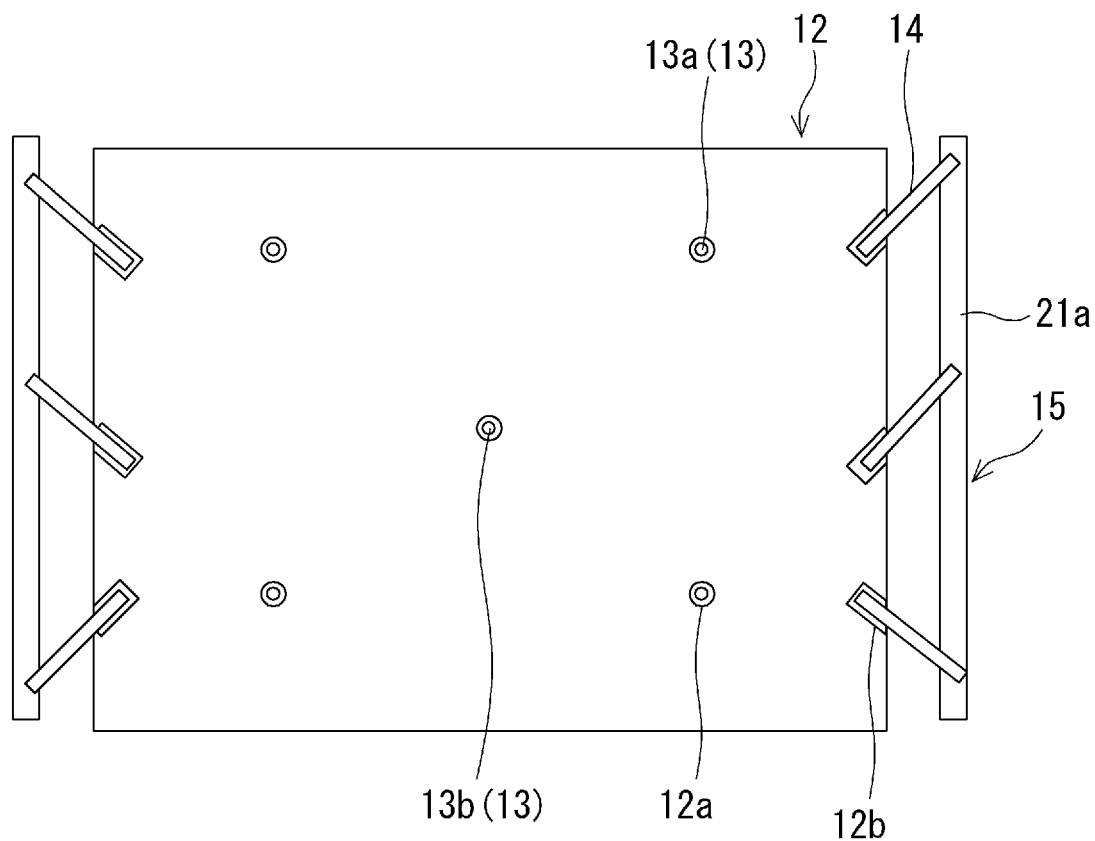
FIG. 10 is a plan view schematically showing a conveyance stage according to a second embodiment.

FIG. 10 is a plan view schematically showing a conveyance stage according to this embodiment. In the conveyance stage 51 according to this embodiment, as shown in FIG. 10, the pusher blade 14 is disposed so as to intersect the short side of the substrate stage 12 at an angle of approximately 45° when viewed in the Z-axis direction.

The effect of disposing the pusher blade 14 is explained in comparison with the case where the pusher blade 14 according to the first embodiment is disposed. First, the case where the laser light is applied to the substrate S using the conveyance stage 5 according to the first embodiment will be considered.

Figure 11:
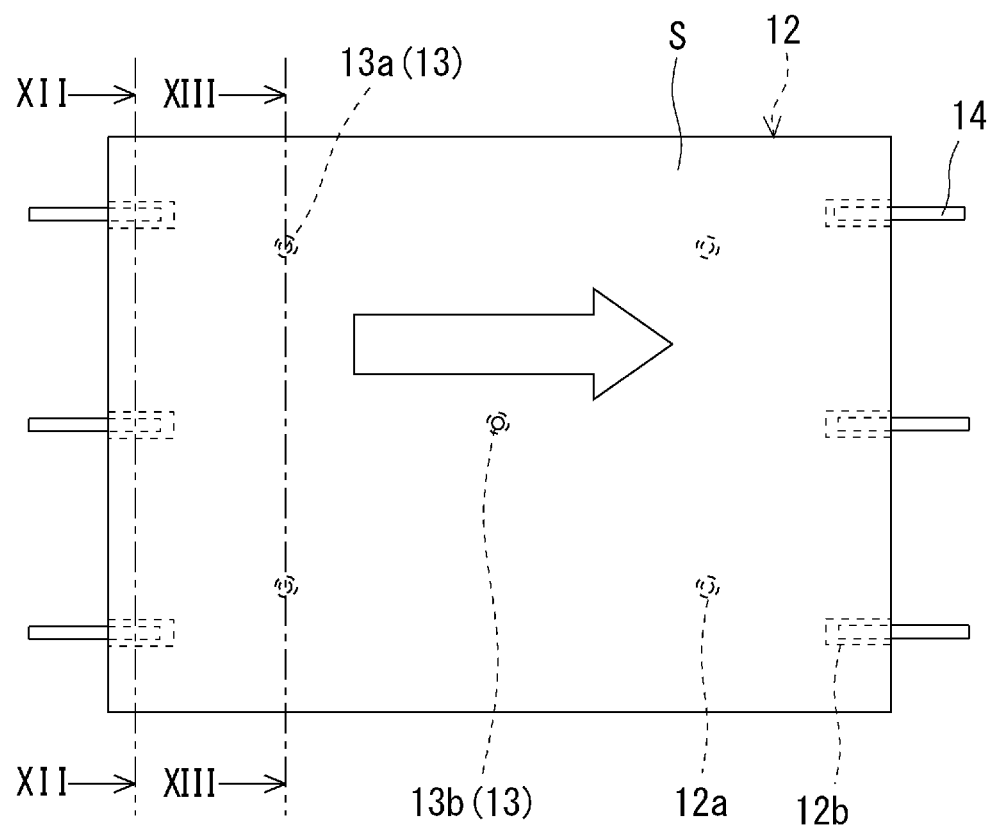
FIG. 11 is a plan view schematically showing how a laser light is applied to a substrate when a longitudinal direction of a substrate stage according to the first embodiment is oriented in an X-axis direction and while moving the substrate stage in an X-axis negative direction.
Figure 12:
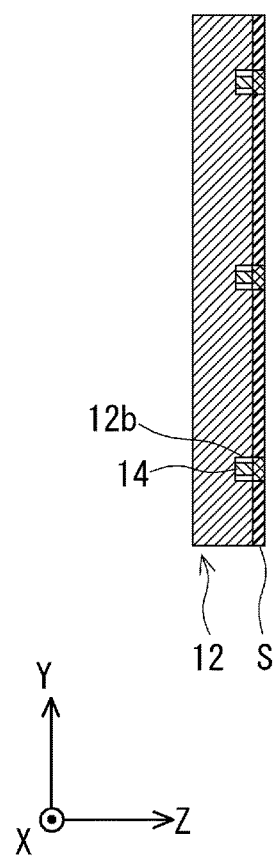
FIG. 12 is a cross section taken along a line XII-XII in FIG. 11.
Figure 13:
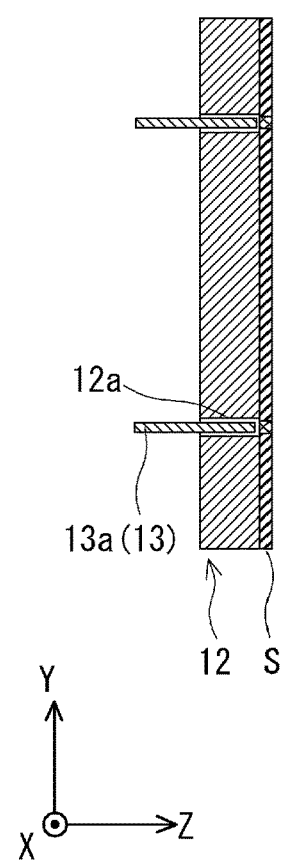
FIG. 13 is a cross section taken along a line XIII-XIII in FIG. 11.
Figure 14:
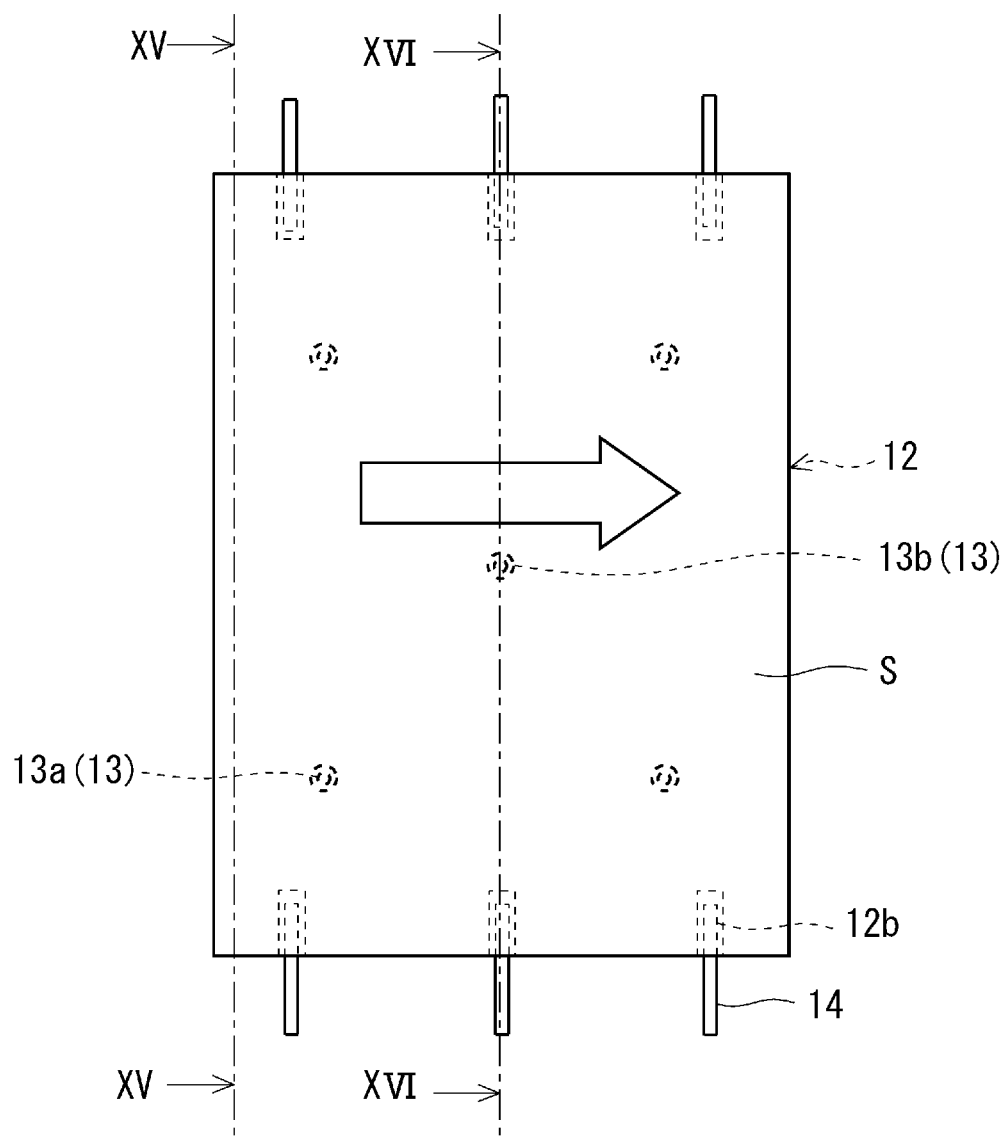
FIG. 14 is a plan view schematically showing how a laser light is applied to a substrate when a short-side direction of the substrate stage according to the first embodiment is oriented in an X-axis direction and while moving the substrate stage in an X-axis negative direction.
Figure 15:
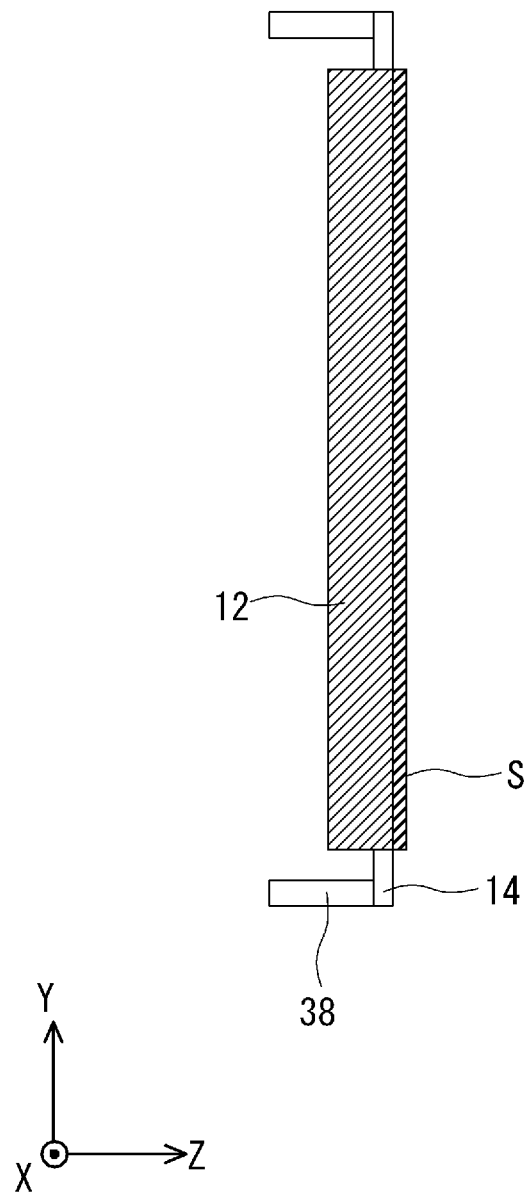
FIG. 15 is a cross section taken along a line XV-XV in FIG. 14.
Figure 16:
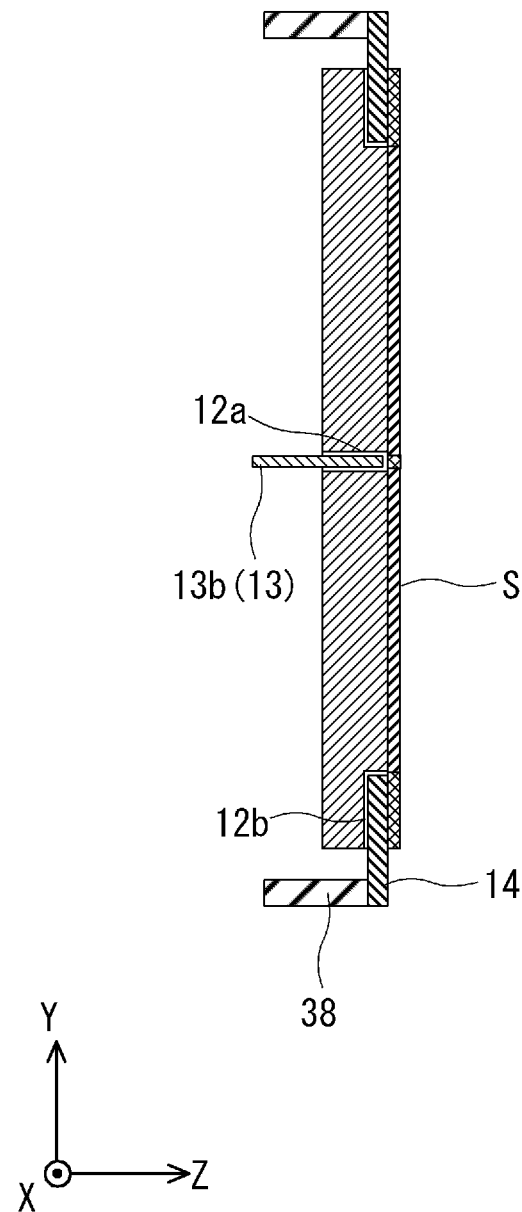
FIG. 16 is a cross section taken along a line XVI-XVI in FIG. 14.

FIG. 11 is a plan view schematically showing how a laser light is applied to a substrate when a longitudinal direction of the substrate stage according to the first embodiment is oriented in the X-axis direction and while moving the substrate stage in the X-axis negative direction. FIG. 12 is a cross section taken along a line XII-XII in FIG. 11. FIG. 13 is a cross section taken along a line XIII-XIII in FIG. 11. FIG. 14 is a plan view schematically showing how a laser light is applied to a substrate when a short-side direction of the substrate stage according to the first embodiment is oriented in the X-axis direction and while moving the substrate stage in the X-axis negative direction. FIG. 15 is a cross section taken along a line XV-XV in FIG. 14. FIG. 16 is a cross section taken along a line XVI-XVI in FIG. 14.

As shown in FIG. 11, the substrate S is placed over a surface on the Z-axis positive side of the substrate stage 12, whose longitudinal direction is oriented in the X-axis direction, and a linear beam, whose longitudinal direction is oriented in the Y-axis direction, is applied to the substrate S, whose longitudinal direction is oriented in the X-axis direction, while moving the substrate stage 12 in the X-axis negative direction.

Here, as shown in FIG. 12, in the region of the substrate stage 12 where the groove 12b is formed, the substrate S is affected by the groove 12b when it is processed. Further, as shown in FIG. 13, in the region of the substrate stage 12 where the groove 12a is formed, the substrate S is also affected by the groove 12a when it is processed. Note that in FIGS. 12 and 13, the shaded part is the region where the substrate S is affected when it is processed.

Meanwhile, as shown in FIG. 14, the substrate S is placed over the surface on the Z-axis positive side of the substrate stage 12, whose short-side direction is oriented in the X-axis direction, and a linear beam, whose longitudinal direction is oriented in the Y-axis direction, is applied to the substrate S, whose short-side direction is oriented in the X-axis direction, while moving the substrate stage 12 in the X-axis negative direction.

Here, as shown in FIG. 15, in the region of the substrate stage 12 where the penetrating hole 12a or the groove 12b is not formed, the substrate S is not affected when it is processed whereas as shown in FIG. 16, in the region of the substrate stage 12 where the penetrating hole 12a or the groove 12b is formed, the substrate S is affected by the penetrating hole 12a or the groove 12b when it is processed. Note that in FIG. 16, the shaded part is the region where the substrate S is affected when it is processed.

Here, the influence of the penetrating hole 12a when processing the substrate S is the same between the case where the longitudinal direction of the substrate stage 12 is oriented in the X-axis direction and the substrate stage 12 is moved in the X-axis negative direction and the case where the longitudinal direction of the substrate stage 12 is oriented in the Y-axis direction and the substrate stage 12 is moved in the X-axis negative direction.

On the other hand, when the longitudinal direction of the substrate stage 12 is oriented in the X-axis direction and the substrate stage 12 is moved in the X-axis negative direction, the length of the groove 12b in the Y-axis direction is short and thus, the influence of the groove 12b when processing the substrate S is small. Alternatively, when the longitudinal direction of the substrate stage 12 is oriented in the Y-axis direction and the substrate stage 12 is moved in the X-axis negative direction, the length of the groove 12b in the Y-axis direction is long and thus, the influence of the groove 12b when processing the substrate S is large. Therefore, the influence of the groove 12b when processing the substrate S varies depending on the arrangement of the substrate stage 12.

Next, the case where the laser light is irradiated on the substrate S using the conveyance stage 51 according to this embodiment is considered.

Figure 17:
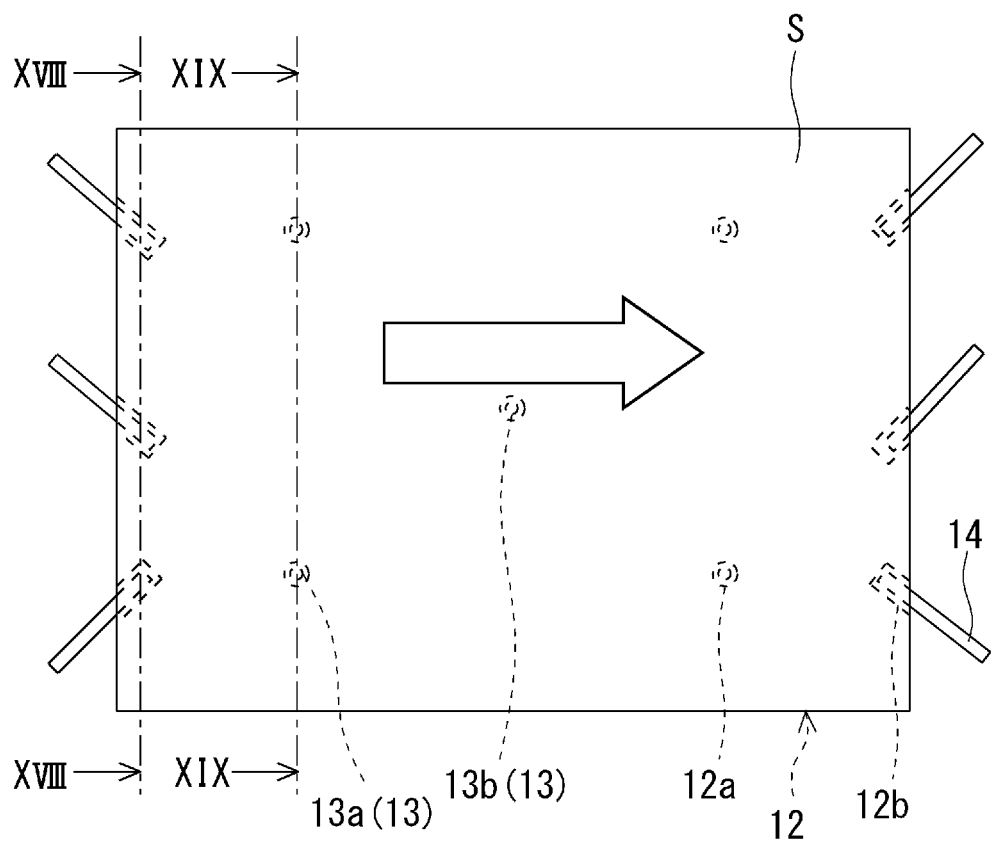
FIG. 17 is a plan view schematically showing how a laser light is applied to a substrate when a longitudinal direction of a substrate stage according to the second embodiment is oriented in an X-axis direction and while moving the substrate stage in an X-axis negative direction.
Figure 18:
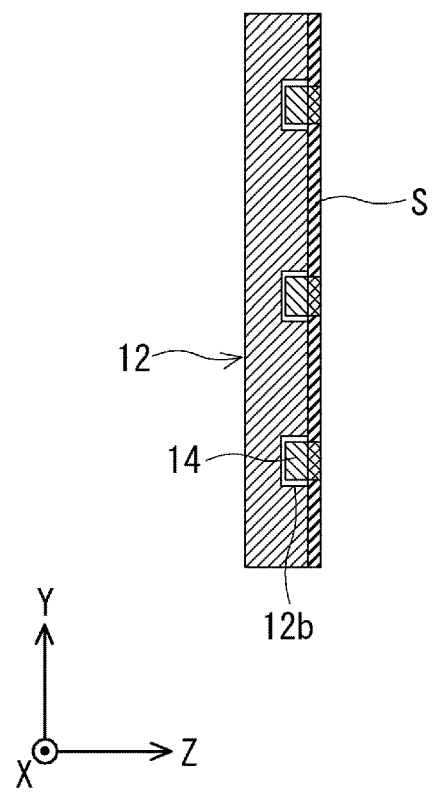
FIG. 18 is a cross section taken along a line XVIII-XVIII in FIG. 17.
Figure 19:
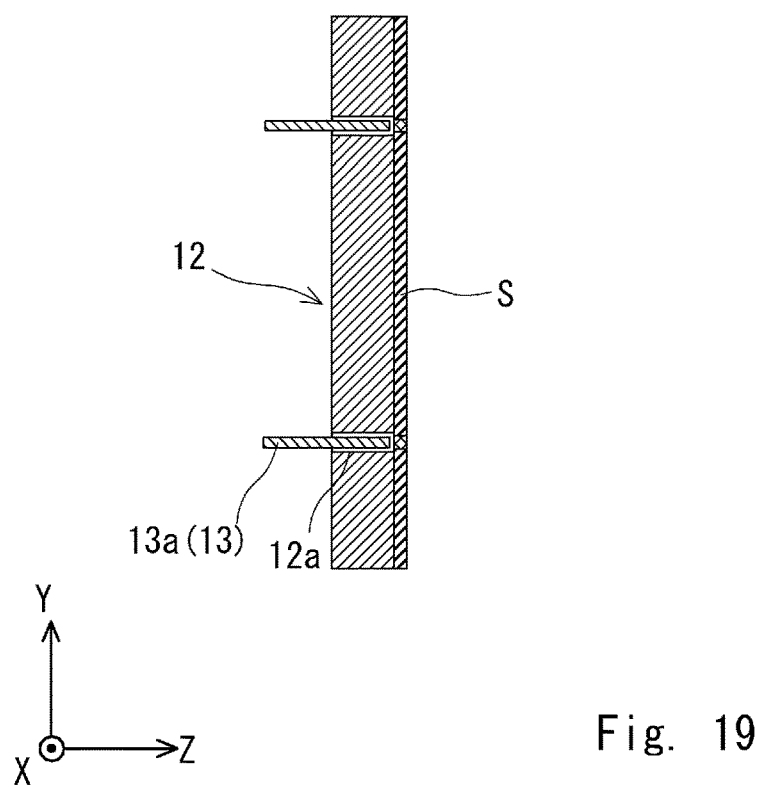
FIG. 19 is a cross section taken along a line XIX-XIX in FIG. 17.
Figure 20:
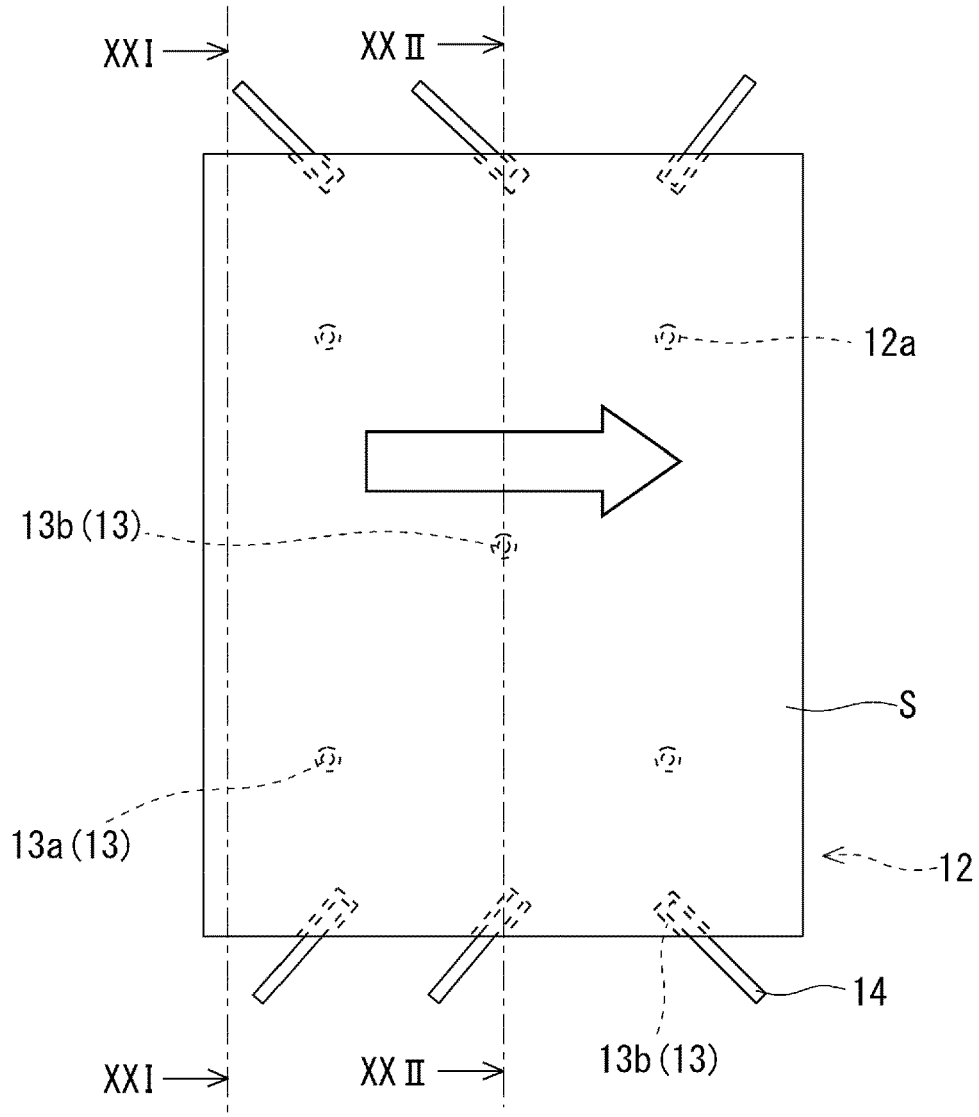
FIG. 20 is a plan view schematically showing how a laser light is applied to a substrate when a short-side direction of the substrate stage according to the second embodiment is oriented in an X-axis direction and while moving the substrate stage in the X-axis negative direction.
Figure 21:
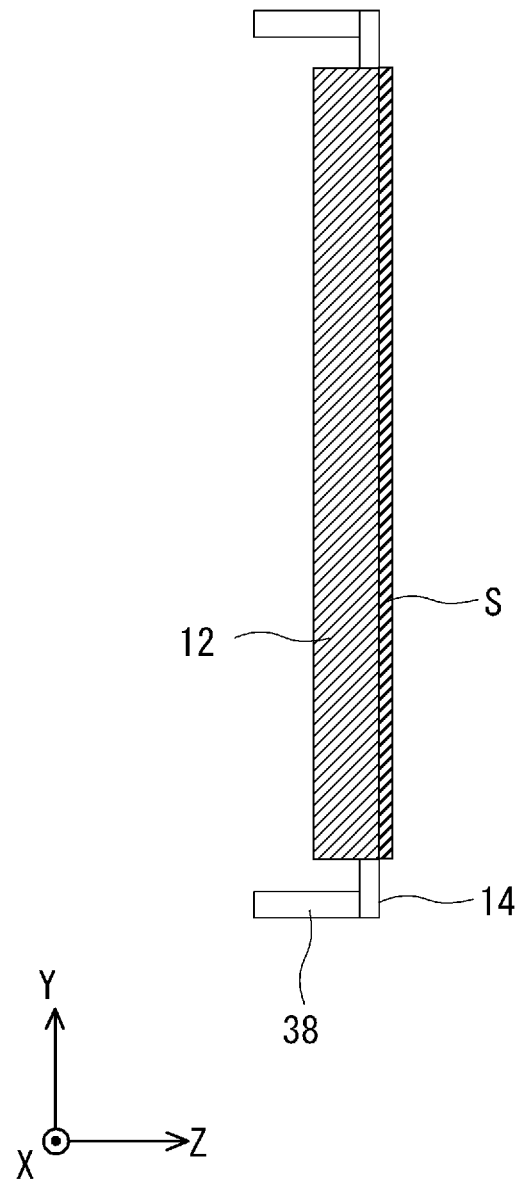
FIG. 21 is a cross section taken along a line XXI-XXI in FIG. 20.
Figure 22:
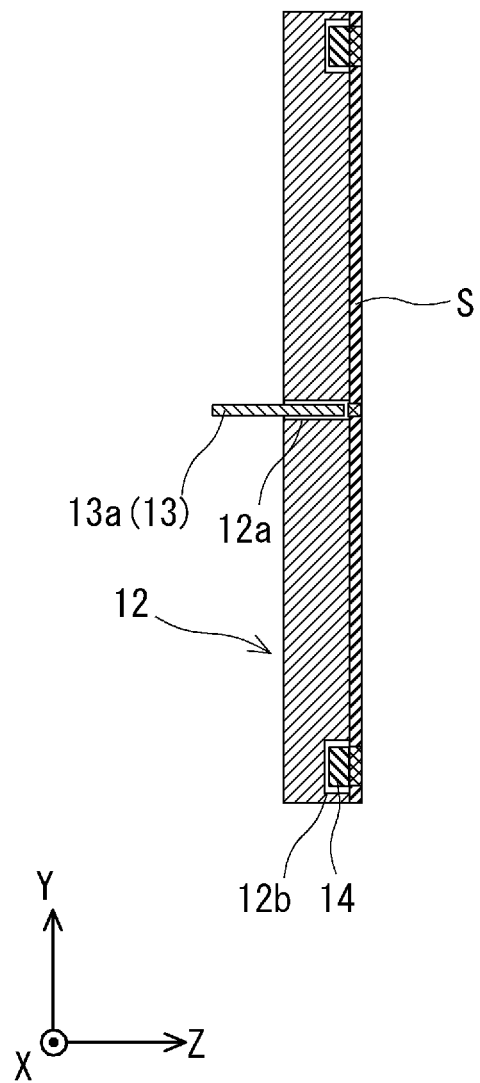
FIG. 22 is a cross section taken along a line XXII-XXII in FIG. 20.

FIG. 17 is a plan view schematically showing how a laser light is applied to a substrate when a longitudinal direction of the substrate stage according to this embodiment is oriented in an X-axis direction and while moving the substrate stage in an X-axis negative direction. FIG. 18 is a cross section taken along a line XVIII-XVIII in FIG. 17. FIG. 19 is a cross section taken along a line XIX-XIX in FIG. 17. FIG. 20 is a plan view schematically showing how a laser light is applied to a substrate when a short-side direction of the substrate stage according to this embodiment is oriented in an X-axis direction and while moving the substrate stage in the X-axis negative direction. FIG. 21 is a cross section taken along a line XXI-XXI in FIG. 20. FIG. 22 is a cross section taken along a line XXII-XXII in FIG. 20.

As shown in FIG. 17, the substrate S is placed over a surface on the Z-axis positive side of the substrate stage 12, whose longitudinal direction is oriented in the X-axis direction, and a linear beam, whose longitudinal direction is oriented in the Y-axis direction, is applied to the substrate S, whose longitudinal direction is oriented in the X-axis direction, while moving the substrate stage 12 in the X-axis negative direction.

Here, as shown in FIG. 18, in the region of the substrate stage 12 where the groove 12b is formed, the substrate S is affected by the groove 12b when it is processed. Further, as shown in FIG. 19, in the region of the substrate stage 12 where the penetrating hole 12a is formed, the substrate S is affected by the penetrating hole 12a when it is processed. Note that in FIGS. 18 and 19, the shaded part is the region where the substrate S is affected when it is processed.

On the other hand, as shown in FIG. 20, the substrate S is placed over the surface of the substrate stage 12 on the Z-axis positive side, the short-side direction of the substrate stage 12 being oriented in the X-axis direction and the short-side direction of the substrate S being oriented in the X-axis direction, and the laser beam is applied to the substrate S while moving the substrate stage 12 in the X-axis negative direction, the longitudinal direction of the laser beam being the Y-axis direction.

Here, in the region of the substrate stage 12 where the penetrating hole 12a and the groove 12b are not formed, the substrate S is not affected when it is processed as shown in FIG. 21, whereas in the region of the substrate stage 12 where the penetrating hole 12a and the groove 12b are formed, the substrate S is affected when it is processed as shown in FIG. 22. Note that in FIG. 22, the shaded part is the region where the substrate S is affected when it is processed.

Here, the influence of the penetrating hole 12a when processing the substrate S is the same between the case where the longitudinal direction of the substrate stage 12 is oriented in the X-axis direction and the substrate stage 12 is moved in the X-axis negative direction and the case where the longitudinal direction of the substrate stage 12 is oriented in the Y-axis direction and the substrate stage 12 is moved in the X-axis negative direction.

Meanwhile, the groove 12b is disposed so as to intersect the short side of the substrate stage 12 on the X-axis positive side at an angle of approximately 45°. Therefore, the length of the groove 12b in the Y-axis direction (specifically, the cross section in the YZ plane) in the case where the longitudinal direction of the substrate stage 12 is oriented in the X-axis direction and the substrate stage 12 is moved in the X-axis negative direction is substantially the same as that in the case where the longitudinal direction of the substrate stage 12 is oriented in the Y-axis direction and the substrate stage 12 is moved in the X-axis negative direction.

Therefore, when the laser light is applied to the substrate S using the conveyance stage 51 according to this embodiment, the influence of the groove 12b when processing the substrate S can be made substantially uniform irrespective of whether the longitudinal direction of the substrate stage 12 is oriented in the X-axis direction or in the Y-axis direction as compared to the case where the laser light is applied to the substrate S using the conveyance stage 5 according to the first embodiment.

Furthermore, since the groove 12b according to this embodiment is disposed so as to intersect the short side of the substrate stage 12 at an angle of approximately 45° when viewed in the Z-axis direction, the length of the groove 12b in the Y-axis direction is short as compared to that of the groove 12b according to the first embodiment in which the longitudinal direction of the substrate stage 12 is oriented in the Y-axis direction and thus, it is possible to suppress the influence of the groove 12b when processing the substrate S as much as possible.

However, although the groove 12b according to this embodiment is disposed so as to intersect the short side of the substrate stage 12 at an angle of approximately 45° when viewed in the Z-axis direction, the longitudinal direction of the substrate stage 12 may be oriented in either the X-axis direction or the Y-axis direction as long as the influence of the groove 12b when processing the substrate S can be made substantially uniform. For example, the groove 12b may be disposed so as to intersect the short side of the substrate stage 12 at an angle of 40° to 50°.

Third Embodiment

The conveyance stage of the laser irradiation apparatus according to this embodiment is configured in substantially the same manner as the conveyance stage 5 of the laser irradiation apparatus 1 according to the first embodiment, except that the shape of the pusher blade differs. The conveyance stage of the laser irradiation apparatus according to this embodiment is configured in substantially the same manner as the conveyance stage 5 of the laser irradiation apparatus 1 according to the first embodiment and thus, duplicated explanations are omitted and the same reference symbols are assigned to the equivalent elements.

Figure 23:
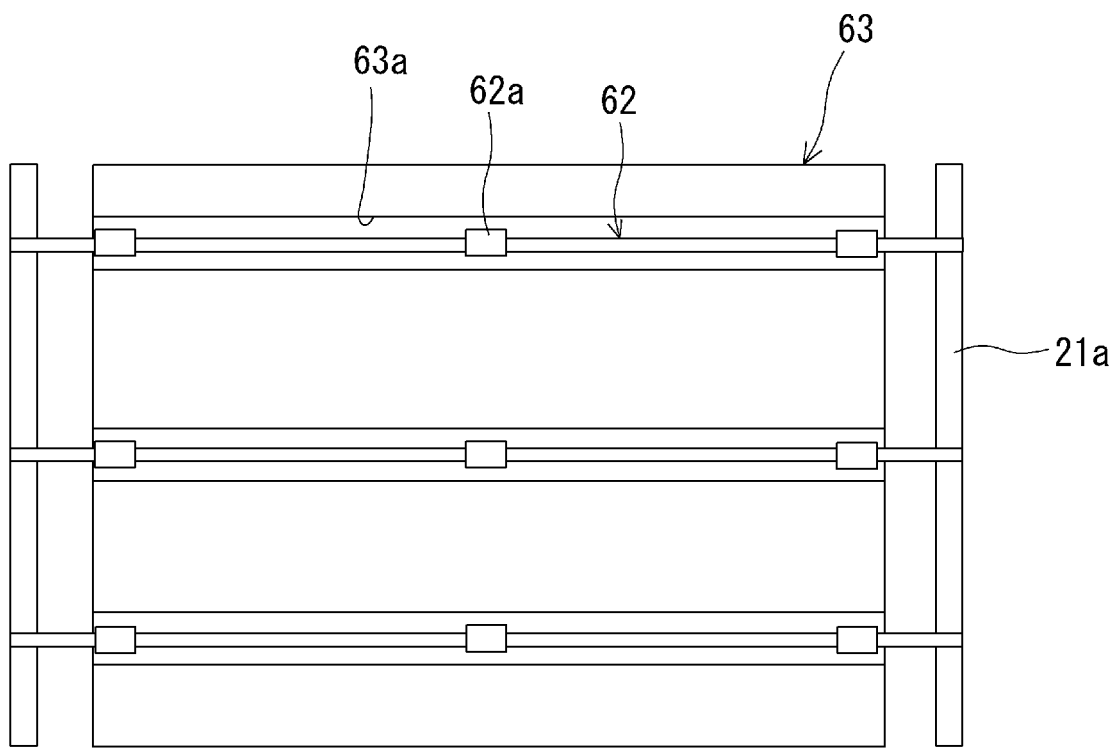
FIG. 23 is a plan view schematically showing a conveyance stage according to a third embodiment.
Figure 23:
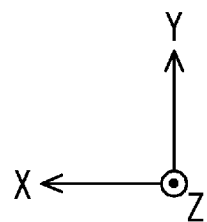
Figure 24:
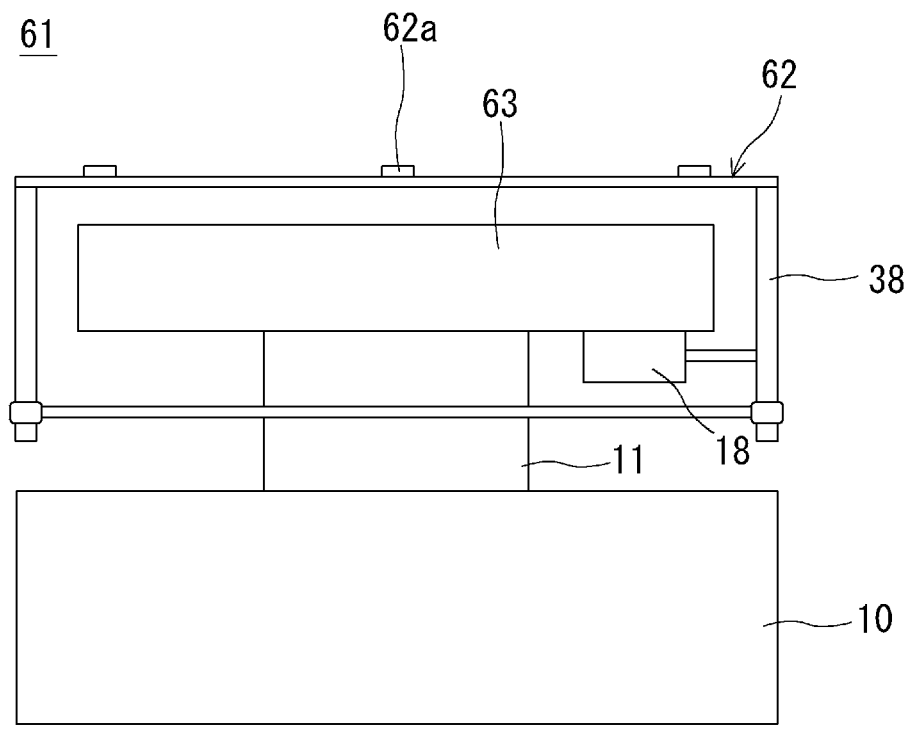
FIG. 24 is a side view schematically showing a state in which a pusher blade is elevated in the conveyance stage according to the third embodiment.

FIG. 23 is plan view schematically showing the conveyance stage according to this embodiment. FIG. 24 is a side view schematically showing a state in which a pusher blade is elevated in the conveyance stage according to this embodiment.

In the conveyance stage 61 according to this embodiment, as shown in FIGS. 23 and 24, the pusher blade 62 is bridged over the connecting members 38 that are opposite to each other with the substrate stage 63 interposed therebetween, and can be accommodated in the groove 63a formed in the substrate stage 63. Here, the pusher pin 13 etc. according to the first embodiment can be omitted.

The pusher blade 62 described above can support the substrate S over a wide area and can lift/lower the substrate S in a stable manner compared to the case where the substrate S is supported by the pusher pin 13 and the pusher blade 14 according to the first embodiment.

Here, it is preferable that a resin part (a resin pad) 62a be provided to the end part of the pusher blade 62 on the Z-axis positive side in an attachable/detachable manner as shown in FIGS. 23 and 24. By this configuration, damage to the substrate S can be restrained when the substrate S is supported by the pusher blade 62.

Here, when the substrate S is processed by applying laser light thereto, due to a space (the groove or the penetrating hole) formed to the substrate S on the Z-axis negative side, the heating state of the substrate S differs between the region of the substrate S that overlaps the space and the region other than the overlapped region, causing the processing to become uneven between the regions. Then, when the planar region of the groove or the penetrating hole becomes larger, the unevenness in the processing becomes more conspicuous in the substrate S.

Therefore, comparing FIGS. 2 and 10 with FIG. 23, the planar regions of the grooves 12b according to the first and second embodiments are narrower than the planar region of the groove 63a according to the third embodiment and thus, unevenness in the processing of the substrate S can be restrained when the substrate S is processed using the laser irradiation apparatuses according to the first and second embodiments compared to the case where the laser irradiation apparatus according to the third embodiment is used.

As described above, the invention made by the inventors of the present application has been explained based on the embodiments, however it is not to be limited thereto and may be varied in many ways without departing from the spirit and scope of the invention.

For example, in the aforementioned embodiments, the pusher pin and the pusher blade are moved up and down by using a rack, a pinion or the like, however, they may be moved up and down by using a linear actuator or the like.

REFERENCE SIGNS LIST

1 LASER IRRADIATION APPARATUS
2 CHAMBER
2a SIDE WALL
2b CONVEYANCE PORT
2c SHUTTER
2d CEILING
2e OPENING
2f BOTTOM SURFACE
3 LASER IRRADIATION UNIT
7 LASER LIGHT SOURCE
8 MIRROR
9 PROJECTION LENS
4 BASE PART
5 CONVEYANCE STAGE
6 SUBSTRATE CONVEYANCE MECHANISM
6a FORK
6b ROBOT HAND
10 STAGE
16 X-AXIS RAIL
17 Y-AXIS RAIL
11 BASE FLANGE
12 SUBSTRATE STAGE
12a PENETRATING HOLE
12b GROOVE PART
13 PUSHER PIN
13a FIRST PUSHER PIN
13b SECOND PUSHER PIN
13c RESIN PART
13d BASE PART
13e FITTING PART
13f ENGAGEMENT PART
14 PUSHER BLADE
15 DRIVING UNIT
18 MOTOR
19 FIRST DRIVING FORCE TRANSMISSION UNIT
22 LINEAR DRIVING UNIT
23 TRANSMISSION ARM
24 ROTARY SHAFT
27 CONNECTING MEMBER
28 RACK
30 FIRST PINION
31 SECOND PINION
32 THIRD PINION
20 SECOND DRIVING FORCE TRANSMISSION UNIT
20a DRIVING FORCE TRANSMISSION UNIT FOR TRANSMITTING DRIVING FORCE TO FIRST PUSHER PIN
20c SUPPORT PART
20d RACK
20b DRIVING FORCE TRANSMISSION UNIT FOR TRANSMITTING DRIVING FORCE TO SECOND PUSHER PIN
20e SUPPORT PART
20f RACK
21 THIRD DRIVING FORCE TRANSMISSION UNIT
21a PUSHER ARM
21b RACK
26 FIRST FIXING MEMBER
29 SECOND FIXING MEMBER
33, 35, 37 GUIDING MECHANISM
34, 36, 38 CONNECTING MEMBER
51 CONVEYANCE STAGE
61 CONVEYANCE STAGE
62 PUSHER BLADE
63 SUBSTRATE STAGE
63a GROOVE
100 CONVEYANCE STAGE
101 DRIVING UNIT
102 MOTOR
103 LINK MECHANISM
B BOLT
L1 LASER LIGHT
R PROCESSING ROOM
S SUBSTRATE

The invention claimed is:

1. A laser irradiation apparatus comprising:
a laser irradiation unit configured to apply laser light to a substrate;
a base part; and
a conveyance stage configured to convey the substrate, wherein the conveyance stage comprises:
a stage configured to be movable above the base part;

a base flange fixed to an upper surface of the stage;
a substrate stage fixed to an upper end part of the base flange so that a center of the substrate stage is disposed on a rotational axis of the base flange extending in a vertical direction, the substrate stage being configured so that the substrate is placed thereover;
a pusher pin for supporting the substrate, the pusher pin being configured to penetrate the substrate stage and to be movable up and down; and
a driving unit configured to move the pusher pin up and down, the driving unit being directly fixed to a bottom surface of the substrate stage, and
wherein the base flange rotatably supports the substrate stage about the rotational axis extending in the vertical direction.

2. The laser irradiation apparatus according to claim 1, wherein the upper end part of the base flange and the substrate stage are connected to each other by a bolt.

3. The laser irradiation apparatus according to claim 1, wherein the conveyance stage comprises:
a pusher arm disposed on an outer side of the substrate stage and configured to be movable up and down; and
a plurality of pusher blades for supporting the substrate, the pusher blades being connected to the pusher arm and disposed on a periphery of the substrate stage.

4. The laser irradiation apparatus according to claim 3, wherein a plurality of grooves each corresponding to a respective one of the plurality of pusher blades are formed in a top surface of the substrate stage.

5. The laser irradiation apparatus according to claim 3, wherein
a planar shape of the substrate is quadrilateral, and
the pusher blades are disposed so as to intersect a first side of the substrate or a second side thereof opposite to the first side.

6. The laser irradiation apparatus according to claim 5, wherein the pusher blades are disposed so as to be orthogonal to the first side of the substrate or the second side thereof.

7. The laser irradiation apparatus according to claim 5, wherein the pusher blades are disposed so as to intersect the first side of the substrate or the second side thereof at an angle of 40° to 50°.

8. The laser irradiation apparatus according to claim 1, wherein
the pusher pin comprises a base part and a resin part disposed at a tip end side of the pusher pin with respect to the base part, and
the resin part is attachable/detachable to/from the base part.

9. The laser irradiation apparatus according to claim 1, wherein
an amorphous semiconductor is formed in the substrate carried into the laser irradiation apparatus, and
a polycrystalline semiconductor is formed in the substrate by applying laser light to the amorphous semiconductor by the laser irradiation unit.

10. The laser irradiation apparatus according to claim 1, wherein the stage is an XY stage configured to move horizontally along a first rail extending in a first direction and a second rail extending in a second direction orthogonal to the first direction.

11. The laser irradiation apparatus according to claim 1, wherein the driving unit further comprises:
a motor;
a first rack disposed on a side of the base flange and configured to horizontally move by a driving force of the motor; and
a rotary shaft disposed on the side of the base flange and configured to rotate as the first rack moves;
a support part configured to support the pusher pin; and
a second rack disposed in the support part and engaged with a pinion of the rotary shaft.

12. A laser irradiation apparatus comprising:
a laser irradiation unit configured to apply laser light to a substrate;
a base part; and
a conveyance stage configured to convey the substrate, wherein the conveyance stage comprises:
a stage configured to be movable above the base part;
a base flange fixed over the stage;
a substrate stage fixed to an upper end part of the base flange and configured so that the substrate is placed thereover;
a pusher pin for supporting the substrate, the pusher pin being configured to penetrate the substrate stage via a through-hole vertically passing through the substrate stage;
a pusher blade for supporting the substrate, the pusher blade being disposed on a periphery of the substrate stage; and
a driving unit including a motor, the driving unit being directly connected to a bottom surface of the substrate stage, wherein
the base flange rotatably supports the substrate stage about a vertically-extending rotational axis, and
the pusher pin and the pusher blade are movable up and down by driving force of the motor.

13. The laser irradiation apparatus according to claim 12, wherein the driving unit further comprises:
a first rack disposed on a side of the base flange and configured to horizontally move by a driving force of the motor; and
a rotary shaft disposed on the side of the base flange and configured to rotate as the first rack moves;
a support part configured to support the pusher pin; and
a second rack disposed in the support part and engaged with a pinion of the rotary shaft.

14. A laser irradiation apparatus comprising:
a laser irradiation unit configured to apply laser light to a substrate;
a base part; and
a conveyance stage configured to convey the substrate, wherein the conveyance stage comprises:
a stage configured to be movable above the base part;
a base flange fixed over the stage;
a substrate stage fixed to an upper end part of the base flange and configured so that the substrate is placed thereover;
a pusher pin for supporting the substrate, the pusher pin being configured to penetrate the substrate stage and to be movable up and down; and
a driving unit configured to move the pusher pin up and down, the driving unit being fixed to a bottom surface of the substrate stage, wherein the driving unit further comprises:
a first rack disposed on a side of the base flange and configured to horizontally move by a driving force of a motor; and
a rotary shaft disposed on the side of the base flange and configured to rotate as the first rack moves;
a support part configured to support the pusher pin; and
a second rack disposed in the support part and engaged with a pinion of the rotary shaft, and wherein the base flange rotatably supports the substrate stage about a rotation axis extending in a vertical direction.

\* \* \* \* \*